United States Patent
Moddel

(10) Patent No.: US 9,581,142 B2
(45) Date of Patent: Feb. 28, 2017

(54) RADIATING POWER CONVERTER AND METHODS

(71) Applicant: The Regents of the University of Colorado, a body corporate, Denver, CO (US)

(72) Inventor: Garret Moddel, Boulder, CO (US)

(73) Assignee: The Regents of the University of Colorado, A Body Corporate, Denver, CO (US)

( * ) Notice: Subject to any disclaimer, the term of this patent is extended or adjusted under 35 U.S.C. 154(b) by 233 days.

(21) Appl. No.: 14/308,166

(22) Filed: Jun. 18, 2014

(65) Prior Publication Data

US 2014/0373535 A1    Dec. 25, 2014

Related U.S. Application Data

(60) Provisional application No. 61/837,040, filed on Jun. 19, 2013.

(51) Int. Cl.

| | |
|---|---|
| *F03G 6/00* | (2006.01) |
| *H01L 31/00* | (2006.01) |
| *H01L 31/08* | (2006.01) |
| *H01L 35/00* | (2006.01) |

(52) U.S. Cl.
CPC .............. *F03G 6/001* (2013.01); *H01L 31/00* (2013.01); *H01L 31/08* (2013.01); *H01L 35/00* (2013.01); *Y02E 10/00* (2013.01); *Y02E 10/46* (2013.01)

(58) Field of Classification Search
CPC ......... F03G 6/001; H01L 31/00; H01L 35/00; H01L 31/08; Y02E 10/00

USPC ........... 60/641.1, 641.2, 641.8; 136/200, 206
See application file for complete search history.

(56) References Cited

U.S. PATENT DOCUMENTS

| | | | | |
|---|---|---|---|---|
| 3,225,208 | A * | 12/1965 | Wolfe .................... | B64G 1/446 136/206 |
| 6,534,784 | B2 | 3/2003 | Eliasson et al. | |
| 2008/0283109 | A1* | 11/2008 | Mankins ............. | B01J 19/0093 136/206 |
| 2010/0154855 | A1* | 6/2010 | Nemir .................... | H01L 35/34 136/205 |

(Continued)

OTHER PUBLICATIONS

Roberta Kwok, Idaho National Laboratory, Flexible Nanoantenna Arrays Capture Abundant Solar Energy, 2008, RenewableEnergyWorld.com, http://www.renewableenergyworld.com/rea/news/story?id,53300.

(Continued)

*Primary Examiner* — Hoang Nguyen
(74) *Attorney, Agent, or Firm* — Pritzkau Patent Group, LLC

(57) ABSTRACT

An energy conversion device generates electrical power responsive to a flow of thermal power. An energy radiator is in thermal communication with the energy converter and includes an input side for receiving the flow from the energy converter and an output side that is tuned for selectively emitting at least a portion of the thermal flow in a bandwidth at which the atmosphere of Earth is substantially transparent and/or with a sufficiently small radiation angle such that the portion of the thermal flow can be radiated to outer space. In one system, the energy conversion device held at least near an ambient temperature. In another system, the energy conversion device is maintained below an ambient temperature.

20 Claims, 2 Drawing Sheets

(56) References Cited

U.S. PATENT DOCUMENTS

2011/0100406 A1* 5/2011 Danenberg .............. H01L 35/32
136/203
2012/0192910 A1* 8/2012 Fowler .................... H01L 35/30
136/206

OTHER PUBLICATIONS

Duncan Graham-Rowe, Is Night Falling on Classic Solar Panels?, Dec. 20, 2010, NewScientist.
Juan Carlos Martinez Anton, Energy Conversion by Thermal Emission Voltaic (TEV) Mechanisms, Apr. 23, 2013, Based on an earlier Spanish patent submission, not available.
Ursula Eicker and Antoine Dalibard, Photovoltaic-Thermal Collectors for Night Radiative Cooling of Buildings, 2011, Solar Energy 85 (2011) 1322-1335.
Eden Rephaeli, Aaswath Raman and Shanhui Fan, Ultrabroadband Photonic Structures to Achieve High-Performance Daytime Radiative Cooling, Mar. 5, 2013, Nano Lett. 2013, 13, 1457-1461.
Xianliang Liu et al., Taming the Black Body with Infrared Metamaterials as Selective Thermal Emitters, Jul. 18, 2011, Physical Review Letters PRL 107, 045901 (2011).
S. Catalanotti et al., The Radiative Cooling of Selective Surfaces, 1975, Solar Energy, vol. 17, pp. 83-89, Pergamon Press, Great Britain.

* cited by examiner

RADIATING POWER CONVERTER AND METHODS

RELATED APPLICATION

The present application claims priority from U.S. Provisional Application Ser. No. 61/837,040, filed on Jun. 19, 2013 and which is hereby incorporated by reference in its entirety.

BACKGROUND

The present application is generally related to the field of power converters and, more particularly, to radiating power converters and associated methods.

One concern with respect to photovoltaic energy conversion resides in the fact that the sun shines only in the daytime. Applicant recognizes that in the absence of inexpensive and efficient energy storage to accommodate nighttime power demand, alternative energy production systems must be available to provide such nighttime power. In this regard, Applicant recognizes that the prior art has provided limited resources with respect to renewable nighttime power.

One potential source of renewable nighttime power is radiation from the surface of the earth. One approach in the prior art proposes to harvest this energy using a rectenna system, consisting of miniature antennas coupled to high-speed diodes as disclosed in "Flexible Nanoantenna Arrays Capture Solar Energy," by Roberta Kwok, Idaho National Laboratory and "Is night falling on classic solar panels?" by Duncan Graham-Rowe, NewScientist, 20 Dec. 2010. Applicant recognizes, however, that there is at least one problem with this scheme, as taught by these references. In particular, the devices of these references appear to be described as operating at ambient temperature. Applicant recognizes that, without special provisions, devices that operate at ambient temperature cannot harvest radiation from an object at that same temperature. According to well-known Carnot conversion efficiency limits, there must be a substantial temperature difference between the source and the conversion device to produce usable power.

Based on the absence of renewable nighttime power resources, another approach that is taken by the prior art resides in reducing nighttime power demand. For example, a system that provides nighttime cooling in conjunction with daytime photovoltaic solar energy conversion is described in "Photovoltaic-thermal collectors for night radiative cooling of buildings," by Ursula Eicker and Antoine Dalibard, Solar Energy 85 (2011) 1322-1335. Unfortunately, photovoltaic energy conversion is limited to the daytime while nighttime cooling is accomplished only through the use of a fluid-based system that provides nighttime cooling independent of daytime photovoltaic power generation.

The foregoing examples of the related art and limitations related therewith are intended to be illustrative and not exclusive. Other limitations of the related art will become apparent to those of skill in the art upon a reading of the specification and a study of the drawings.

SUMMARY

The following embodiments and aspects thereof are described and illustrated in conjunction with systems, tools and methods which are meant to be exemplary and illustrative, not limiting in scope. In various embodiments, one or more of the above-described problems have been reduced or eliminated, while other embodiments are directed to other improvements.

In one aspect of the disclosure, an energy conversion device and associated methods are described in which an energy converter generates electrical power responsive to a flow of thermal power passing therethrough. An energy radiator is in thermal communication with the energy converter and includes an input side for receiving the flow from the energy converter and an output side that is tuned for selectively emitting at least a portion of the thermal flow in a bandwidth at which the atmosphere of Earth is substantially transparent such that the portion of the thermal flow can be radiated to outer space. In one feature, the energy conversion device forms part of a system such that the energy conversion device is supported for receiving the flow of thermal power from a thermal source such that the energy conversion device is held at least near an ambient temperature that is established by the thermal source. In another feature, the energy conversion device forms part of a system such that the energy conversion device is supported in a spaced apart relationship from a thermal source for receiving the flow of thermal power from the thermal source such that the energy conversion device is maintained below an ambient temperature based on the spaced apart relationship.

In another aspect of the disclosure, a method is disclosed for generating electrical power by configuring an energy converter for generating electrical power responsive to a flow of thermal power passing therethrough. An energy radiator is arranged in thermal communication with the energy converter to form an energy conversion device such that an input side of the energy radiator receives the flow from the energy converter and an output side of the energy radiator is tuned for selectively emitting at least a portion of the thermal flow in a bandwidth at which the atmosphere of Earth is substantially transparent such that the portion of the thermal flow can be radiated to outer space.

In yet another aspect of the disclosure, an energy conversion device and associated methods are described in which an energy converter generates electrical power responsive to a flow of thermal power passing therethrough. An energy radiator, in thermal communication with the energy converter, includes an input side for receiving the flow from the energy converter and an output side is configured for selectively emitting at least a portion of the thermal flow in an angular range that is sufficiently limited such that the portion of the thermal flow can be radiated to outer space while limiting absorption from peripheral heat sources.

BRIEF DESCRIPTIONS OF THE DRAWINGS

Example embodiments are illustrated in referenced figures of the drawings. It is intended that the embodiments and figures disclosed herein are to be illustrative rather than limiting.

DETAILED DESCRIPTION

The following description is presented to enable one of ordinary skill in the art to make and use the invention and is provided in the context of a patent application and its requirements. Various modifications to the described embodiments will be readily apparent to those skilled in the art and the generic principles taught herein may be applied to other embodiments. Thus, the present invention is not intended to be limited to the embodiments shown, but is to be accorded the widest scope consistent with the principles and features described herein including modifications and equivalents. It is noted that the drawings are not to scale and are diagrammatic in nature in a way that is thought to best illustrate features of interest. Descriptive terminology may be used with respect to these descriptions, however, this terminology has been adopted with the intent of facilitating the reader's understanding and is not intended as being limiting.

The present Application discloses heretofore unseen systems, apparatus and methods for harvesting energy from an ambient-temperature source. As discussed above, this would seem to be impossible because of the Carnot requirement that the source and converter be at different temperatures, but Applicant recognizes embodiments that overcome limitations with respect to this requirement, as described in detail below.

Embodiments of the present invention can make use of the following components:

1. An ambient-temperature heat source. This can be the surface of the earth or any object that is near the temperature of the surface of the earth. For example, the heat source can be the structure holding the conversion system, such that this structure is heated directly or indirectly by the earth's surface.
2. An energy converter that provides usable electrical power from thermal power passing through it or, equivalently, a temperature difference that is maintained across the energy converter. One suitable, but non-limiting example is a thermoelectric converter.
3. A narrow-band radiator. Such a narrow-band radiator can comprise a selective surface that can radiate energy in a narrow band of wavelengths. One example of a suitable narrow-band radiator, by way of non-limiting example, is an optical grating. In addition to radiating over a narrow band, the narrow-band radiator can also radiate directionally towards component 4, described immediately hereinafter.
4. An energy sink that is at a temperature that is lower than the ambient temperature surrounding the energy converter. Applicant recognizes that outer space can serve as such an energy sink.

Figure 1:
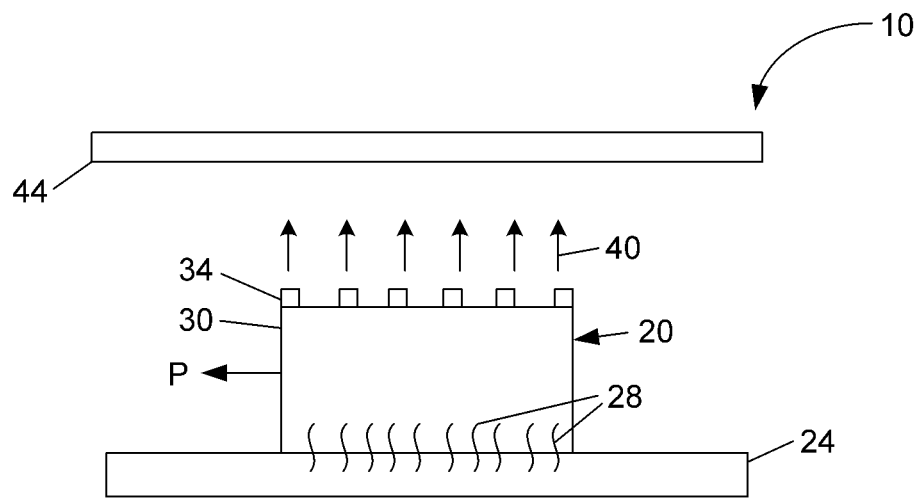
FIG. 1 is a diagrammatic view, in elevation, of an embodiment of an energy conversion system which includes an embodiment of a generalized radiating power converter.

Turning now to the figures wherein like components may be indicated by like designations throughout the various views, attention is immediately directed to FIG. 1 which is an elevational view that diagrammatically illustrates an embodiment of an energy conversion system generally indicated by the reference number 10 which includes an embodiment of a generalized radiating power converter that is indicated by the reference number 20. In the embodiment of FIG. 1, the earth and a conversion system structure, designated by the reference number 24 can provide ambient heat 28 and correspond to component 1, as described above. It is noted that ambient heat 28 may be represented by a set of wavy lines throughout the various figures and can be provided by any suitable source by conduction, convection or radiation. Radiating power converter 20 includes an energy converter 30. The ambient heat can be provided directly or indirectly from the earth and, thereafter, passes or flows through energy converter 30, corresponding to component 2, as described above, which provides usable electric power P.

Radiating power converter 20 further includes a narrow-band radiator 34, component 3 (as described above), that is in thermal communication with energy converter 30 for emitting radiation 40 as indicated by arrows. While the narrow-band radiator can be described as a surface and is diagrammatically illustrated as a set of rectangles, it should be appreciated that the radiator can include any appropriate structure so long as the structure functions in the intended manner. In particular, narrow band radiator 34 is tuned to a wavelength region at which the atmosphere is at least approximately transparent, for example, from 8 microns in wavelength to 13 microns in wavelength, inclusively. Of course, such tuning can generally define a suitable bandwidth that encompasses at least a portion of this range. In this way, radiating power converter 20 can radiate to the sky and outer space 44 which is diagrammatically illustrated and serves as aforementioned component 4, and which is much cooler than the atmosphere of the earth. Since the absorptivity is equal to the emissivity at a given wavelength, if the radiator radiated over a broad band of wavelengths it would also absorb over that band, and would therefore absorb heat from the atmosphere. Accordingly, the bandwidth is chosen by Applicant to correspond to a wavelength window through which radiation can pass without being absorbed by the atmosphere, and in a wavelength or bandwidth range where the atmosphere will not radiate substantially back to the radiator. In addition, the radiator can be directional so as to radiate to sky 44 without absorbing radiation from peripheral heat sources. By way of example, the angular range associated with radiating power converter 20 is diagrammatically illustrated, based on arrows 40, as being limited to a direction that is normal to the structure of radiating power converter 20, although an actual converter may exhibit a relatively narrow range that is centered on the direction of arrows 40 which represents the emitted radiation.

Specific embodiments, yet to be described, convert radiation into usable power by making use of a selective emitter to cool one of the components. This cooling is accomplished by selectively radiating through the surrounding medium to a radiation sink that is at a lower temperature than the ambient. The conversion process can be accomplished in one of two ways:

(i) In one embodiment, the converter is maintained at close to ambient temperature by convective, conductive, or radiative heating, either individually or in any suitable combination, from the surroundings at ambient temperature. The converter radiates as a selective emitter to a lower temperature sink. A fraction of the radiation from the converter is converted to usable power.
(ii) In another embodiment, the converter is maintained below ambient temperature because at least one of the surfaces of the converter is in thermal communication with a selective emitter that is itself radiating to the lower temperature sink. A fraction of the incident radiation is converted to usable power.

A selective emitter that is usable in the context of the present application includes at least one of the following properties that enables it to attain a lower-than-ambient temperature:

(i) Radiation over a bandwidth that enables at least part of the radiation to penetrate the surrounding medium and emit power to the lower-temperature radiation sink.
(ii) Radiation at a selected angle or range of angles that enables at least part of the radiation to penetrate the surrounding medium and emit power to the lower-temperature radiation sink.

Figure 2:
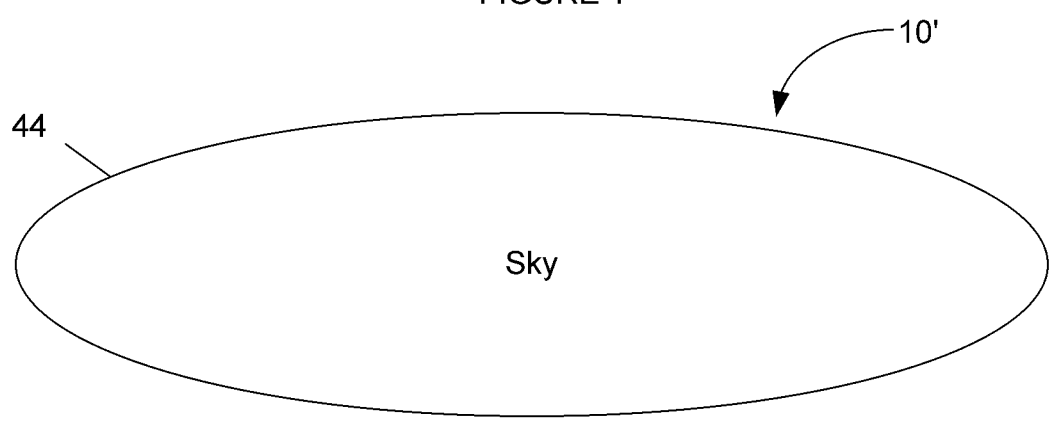
FIG. 2 is a diagrammatic view, in elevation, of an embodiment of an energy conversion system in which a radiating power converter is supported or held at or near ambient temperature.
Figure 2:
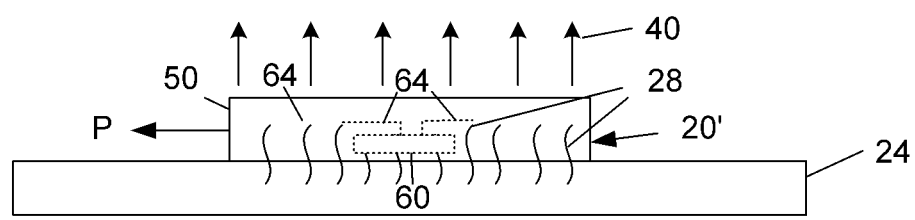

Attention is now directed to FIG. 2, which is a diagrammatic illustration of an embodiment of an energy conversion system, generally indicated by the reference number 10', which includes an embodiment of a radiating power converter that is indicated by the reference number 20'. The latter comprises an infrared rectenna 50 which includes a combination of aforedescribed components 2 and 3 in the form of a diode 60 and an antenna 64, respectively. Rectenna diode 60 converts current fluctuations into DC power, and the fluctuations produce multi-terahertz currents that result in radiation 40. Of course, rectenna 50 can form one rectenna of an array of rectennas that radiate to sky 44. It should be appreciated that the present description can be framed interchangeably in terms of element 50 representing a single rectenna or a rectenna array since rectennas in the form of an array function in a manner that is identical to that of a single rectenna. The antennas, of the rectennas of the present embodiment, are designed to form a narrow-band radiator surface, with the bandwidth tunable by the antenna design, as is well known to those skilled in the art. It is noted that details with respect to rectenna design are described in detail in U.S. Pat. No. 6,534,784 by Eliasson, et al., issued Mar. 18, 2003, which is hereby incorporated by reference, and that these design details remain applicable with respect to rectenna designs in accordance with the present Application.

For the embodiment of FIG. 2, the ultimate (i.e., theoretical) efficiency can be quite large. The reason is that the governing efficiency limit, which is the Carnot or Landsberg efficiency, is dependent upon the difference in temperature between the radiator and the sink. For this embodiment, the sky and outer space serve as a sink while energy converter 20' is held at least near an ambient temperature that is established by the earth and/or thermal conversion system structure 24. When the sink is the sky and outer space, the temperature can be quite low, so that the efficiency can be approach 100%, but Applicant recognizes that other factors can limit the practical efficiency to well below 100%. These losses may include radiation from the atmosphere, which effectively increases the sink temperature above that of outer space, and the efficiency of the conversion unit, which operates at well below ideal efficiency because of limitations in the conversion process.

Figure 3:
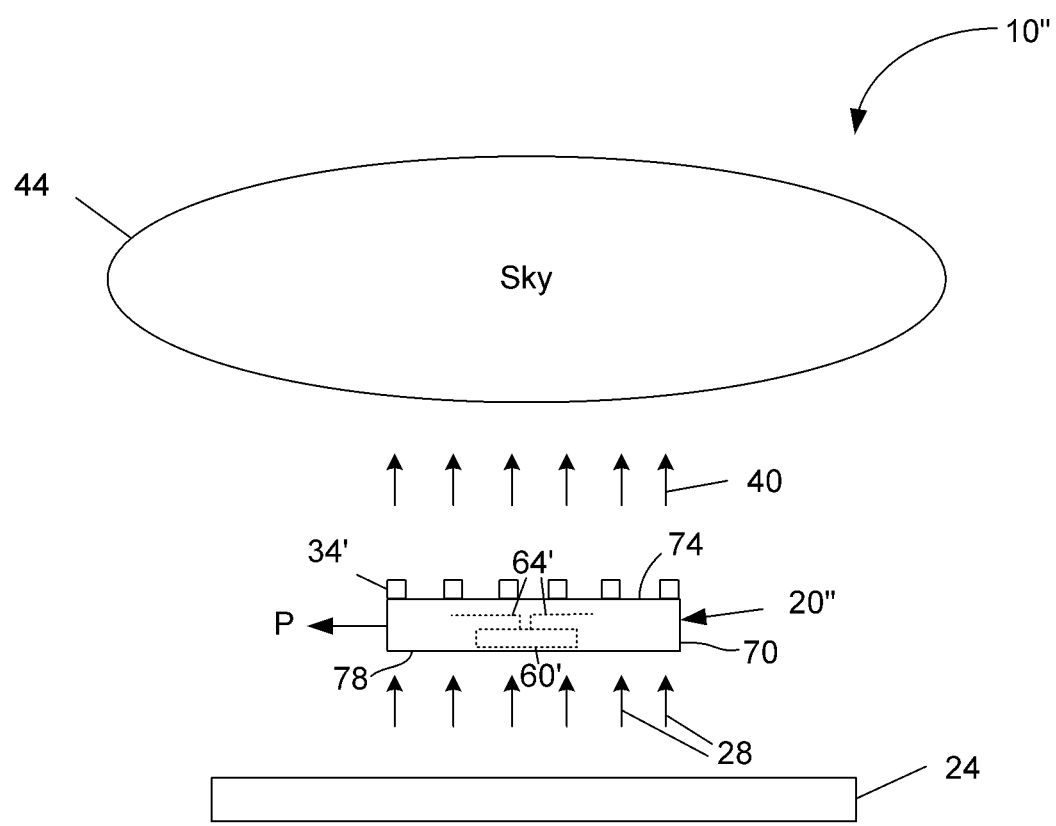
FIG. 3 is a diagrammatic view, in elevation, of an embodiment of an energy conversion system in which a radiating power converter is held below ambient temperature.

Turning now to FIG. 3, another embodiment of an energy conversion system, generally indicated by the reference number 10", includes an embodiment of a radiating power converter that is indicated by the reference number 20". The radiating power converter includes a rectenna array 70 having a non-active side or uppermost side 74, in the view of the figure. Again, it should be appreciated that the present description can be framed interchangeably in terms of element 70 representing a single rectenna or a rectenna array since rectennas in the form of an array function in a manner that is identical to that of a single rectenna. It is noted that one rectenna is diagrammatically shown, indicated by the reference number 60' and having an antenna 64'. Rectenna array 70 serves as the energy converter (component 2, as described above). The rectenna array is coated (e.g., covered) with a frequency-selective surface 34' that is set up to radiate to the sky and which serves as the energy radiator (component 3) of the radiating power converter. In the present embodiment, the frequency-selective surface is illustrated as a grating that is represented by a set of rectangles by way of non-limiting example. It is noted that, in the present embodiment, it is not necessary to configure antenna 64' as a selective emitter due to the presence of frequency-selective surface 34', however, such an additional selective emitter configuration can be provided as part of antenna 64' as is the case in the embodiment of FIG. 2. The frequency-selective surface, in any suitable embodiment according to FIG. 4, cools the rectenna or rectenna array to below ambient temperature. An active side 78 of the rectenna or rectenna array receives radiation from the earth and other ambient-temperature sources, and converts a fraction of the received radiation to DC power P. It is noted that details with respect to selective thermal emitters are described in detail, for example, in "Taming the Black Body with Infrared Metamaterials as Selective Thermal Emitters", Physical Review Letters, PRL 107, 045901, 22 Jul., 2011 which is hereby incorporated by reference.

For the embodiment of FIG. 3, the efficiency will generally be lower than that of the embodiment of FIGS. 2 and 3 at least for the reason that rectenna or rectenna array 70, which here serves as a sink (i.e., receiver) for radiation 28 as ambient heat that is represented by arrows, will at best settle at a few tens of degrees below ambient temperature (see, for instance, "Ultrabroadband Photonic Structures To Achieve High-Performance Daytime Radiative Cooling," Eden Rephaeli, Aaswath Raman, and Shanhui Fan, Nano Lett. 2013, 13, 1457-1461 which is hereby incorporated by reference). This will limit the Carnot or Landsberg efficiency to roughly 10%. For example, consider the case when the temperature $T_{high}$ of the earth is 300 K and the rectenna power converter is cooled to a $T_{low}$ of 270 K. The Carnot efficiency, which is $1-(T_{low}/T_{high})$, is equal to 10%.

For purposes of embodiments of the present disclosure, selective radiation can be attained in any suitable manner either currently available or yet to be developed such as, for example, by using gratings, antennas, antenna arrays, photonic crystals, metamaterials, plasmonic structures, and the like. It is noted that a grating is shown as the frequency selective surface or component, by way of non-limiting example, in FIG. 3 (item 34'). Details with respect to gratings and associated design considerations can be found, for example, in "Techniques for analyzing frequency selective surfaces—a review," Proceedings of the IEEE, 76, 1593-1615, 2002, which is hereby incorporated by reference in its entirety.

The amount of power available for a 300 K radiant power converter is approximately 150 W/m$^2$, which is approximately 15% of the maximum power available from terrestrial sunlight. The radiation can be radiant heat or other wavelengths of electromagnetic radiation, or particle radiation. The usable output power is usually electrical power, but can also be mechanical, acoustical, optical or any other form of usable power, without limitation.

The foregoing description of the invention has been presented for purposes of illustration and description. It is not intended to be exhaustive or to limit the invention to the precise form or forms disclosed, and other embodiments, modifications and variations may be possible in light of the above teachings wherein those of skill in the art will recognize certain modifications, permutations, additions and sub-combinations thereof.

What is claimed is:

1. An energy conversion device, comprising:
    an energy converter that generates electrical power responsive to a flow of thermal power passing therethrough; and
    an energy radiator in thermal communication with the energy converter including an input side for receiving said flow from the energy converter and an output side that is tuned for selectively emitting at least a portion of the thermal flow in a bandwidth that encompasses at least a portion of a bandwidth range extending from 8 microns in wavelength to 13 microns in wavelength, inclusively, such that the portion of the thermal flow can be radiated to outer space.

2. The energy conversion device of claim 1 wherein the energy radiator is an antenna that is integrally formed as part of a rectenna and said antenna is tuned for emitting the portion of the thermal flow.

3. The energy conversion device of claim 1 wherein the energy converter is a thermoelectric converter.

4. The energy conversion device of claim 1 wherein the energy converter is configured as an infrared rectenna and the energy radiator is configured as a layer in thermal contact with the infrared rectenna.

5. The energy conversion device of claim 1 wherein the energy radiator is selected from an optical grating, antennas, antenna arrays, photonic crystals, metamaterials and plasmonic structures.

6. An energy conversion system, comprising:
the energy conversion device of claim 1 supported for receiving the flow of thermal power from a thermal source such that the energy conversion device is held at least near an ambient temperature that is established by the thermal source.

7. The energy conversion system of claim 6 wherein the thermal flow is received from the thermal source by at least one of thermal conduction and thermal convection.

8. The system of claim 6 wherein the energy conversion device is supported such that outer space serves as a heat sink for the output side of the energy radiator.

9. The system of claim 6 wherein the energy converter is in direct thermal contact with the thermal source.

10. An energy conversion system, comprising:
the energy conversion device of claim 1 supported in a spaced apart relationship from a thermal source such that the energy conversion device receives the flow of thermal power from the thermal source and the energy conversion device is maintained below an ambient temperature based on the spaced apart relationship.

11. The energy conversion system of claim 10 wherein the energy converter includes an energy converter input side that confronts the thermal source for exposure to the thermal power from the thermal source.

12. The energy conversion system of claim 10 wherein the energy converter of the energy conversion device is an infrared rectenna having a rectenna output side and the energy radiator is a layer that is in thermal communication with the rectenna output side of the energy converter and the layer is configured to selectively radiate to outer space.

13. The energy conversion device of claim 1 further configured for selectively emitting the portion of the thermal flow in an angular range that is sufficiently limited such that the portion of the thermal flow can be radiated to outer space while limiting absorption from peripheral heat sources.

14. A method for generating electrical power, comprising:
configuring an energy converter for generating electrical power responsive to a flow of thermal power passing therethrough; and
arranging an energy radiator in thermal communication with the energy converter to form an energy conversion device such that an input side of the energy radiator receives said flow from the energy converter and an output side of the energy radiator is tuned for selectively emitting at least a portion of the thermal flow in a bandwidth that encompasses at least a portion of a bandwidth range extending from 8 microns in wavelength to 13 microns in wavelength, inclusively, such that the portion of the thermal flow can be radiated to outer space.

15. The method of claim 14 further comprising:
supporting the energy conversion device for receiving the flow of thermal power by thermal conduction from a thermal source such that the energy conversion device is held at least near an ambient temperature that is established by the thermal source.

16. The method of claim 15 further comprising:
emitting the portion of the energy flow such that outer space serves as a heat sink for the output side of the energy radiator.

17. The method of claim 15 wherein supporting places the input side of the energy conversion device in direct thermal contact with the thermal source.

18. The method of claim 14 further comprising:
supporting the energy conversion device in a spaced apart relationship from a thermal source for receiving the flow of thermal power from the thermal source such that the energy conversion device is maintained below an ambient temperature based on the spaced apart relationship.

19. The method of claim 18 wherein supporting places an energy converter input side of the energy converter in a confronting relationship with the thermal source for exposure to the thermal source.

20. The method of claim 18 further comprising:
configuring the energy converter of the energy conversion device as an infrared rectenna and configuring the energy radiator as a layer that is in thermal communication with the output side of the energy converter to selectively radiate to outer space.

* * * * *